(12) United States Patent
Pai (10) Patent No.: US 9,607,860 B2
(45) Date of Patent: Mar. 28, 2017

(54) ELECTRONIC PACKAGE STRUCTURE AND FABRICATION METHOD THEREOF

(71) Applicant: Siliconware Precision Industries Co., Ltd., Taichung (TW)

(72) Inventor: Yu-Cheng Pai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/981,043

(22) Filed: Dec. 28, 2015

(65) Prior Publication Data
US 2016/0225642 A1    Aug. 4, 2016

(30) Foreign Application Priority Data

Jan. 30, 2015    (TW) .............................. 104103172 A (51) Int. Cl.
*H01L 21/48*    (2006.01)
*H01L 23/495*    (2006.01)
*H01L 23/31*    (2006.01)
*H01L 21/56*    (2006.01)

(52) U.S. Cl.
CPC .... *H01L 21/4832* (2013.01); *H01L 23/49568* (2013.01); *H01L 23/49582* (2013.01); *H01L 21/4825* (2013.01); *H01L 23/3107* (2013.01); *H01L 23/49503* (2013.01); *H01L 23/49548* (2013.01); *H01L 2224/48091* (2013.01); *H01L 2924/181* (2013.01)

(58) Field of Classification Search
CPC ............ H01L 21/4832; H01L 23/3114; H01L 21/4825; H01L 21/565; H01L 23/49503; H01L 23/4952
USPC ......................................................... 257/676
See application file for complete search history.

(56) References Cited

U.S. PATENT DOCUMENTS

2013/0285252 A1\* 10/2013 Sun ..................... H01L 21/6835
257/774
2015/0155250 A1\* 6/2015 Chen ..................... H01L 24/32
257/528

\* cited by examiner

*Primary Examiner* — Caleen Sullivan
(74) *Attorney, Agent, or Firm* — Mintz Levin Cohn Ferris Glovsky and Popeo, P.C.; Peter F. Corless; Steven M. Jensen (57) ABSTRACT

A method for fabricating an electronic package structure is provided, which includes the steps of: forming a circuit layer on a conductor; disposing an electronic element on the circuit layer; forming an insulating layer on the conductor to encapsulate the electronic element and the circuit layer; and removing portions of the conductor so as to cause the remaining portions of the conductor to constitute a plurality of conductive bumps. As such, when the electronic package structure is disposed on a circuit board through an SMT (Surface Mount Technology) process, the conductive bumps are easily aligned with contacts of the circuit board, thereby effectively improving the yield of the SMT process.

17 Claims, 8 Drawing Sheets

ELECTRONIC PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 104103172, filed Jan. 30, 2015, the entire contents of which are incorporated herein by reference.

BACKGROUND OF THE INVENTION

1. Field of the Invention

The present invention relates to packaging technologies, and more particularly, to an electronic package structure and a fabrication method thereof.

2. Description of Related Art

Along with the rapid development of electronic industries, electronic products are developed toward the trend of multi-function and high performance. To meet the miniaturization requirement of semiconductor packages, packaging substrates for carrying semiconductor chips are becoming thinner.

FIGS. 1A to 1D are schematic cross-sectional views showing a method for fabricating a coreless semiconductor package 1 according to the prior art.

Figure 1A:
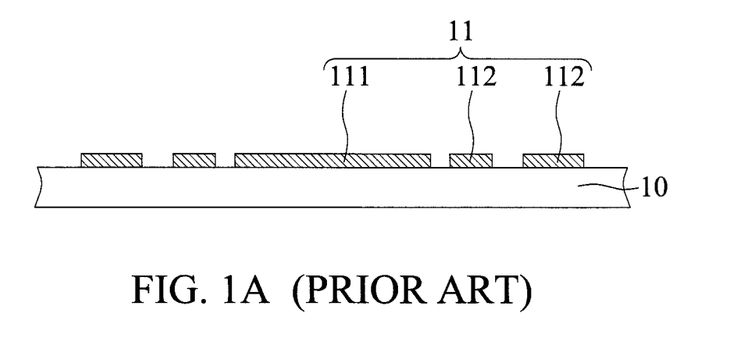
FIGS. 1A to 1D are schematic cross-sectional views showing a method for fabricating a coreless semiconductor package according to the prior art.

Referring to FIG. 1A, a circuit layer 11 is formed on a carrier 10. The circuit layer 11 has a die attach pad 111 and a plurality of conductive pads 112 around the die attach pad 111.

Figure 1B:
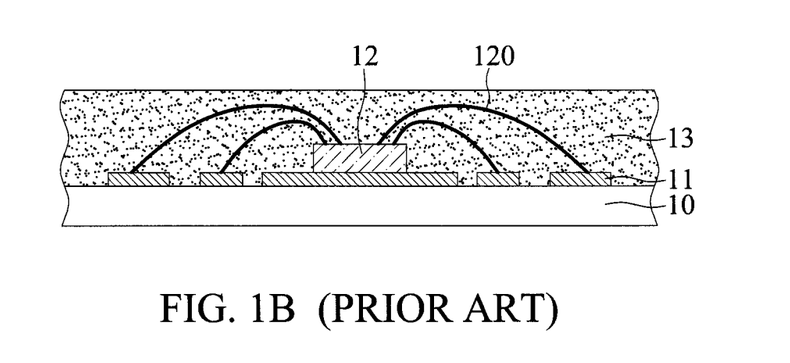

Referring to FIG. 1B, a semiconductor chip 12 is disposed on the die attach pad 111 and electrically connected to the conductive pads 112 through a plurality of bonding wires 120. Then, a first insulating layer 13 is formed on the carrier 10 to encapsulate the semiconductor chip 12 and the bonding wires 120.

Figure 1C:
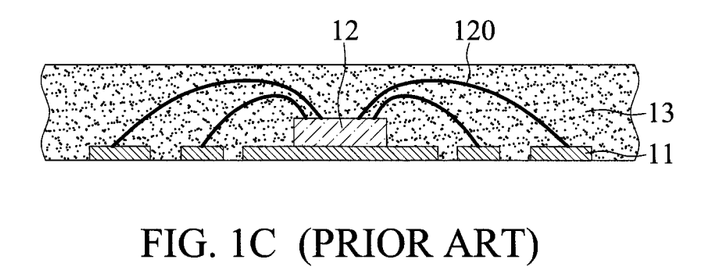

Referring to FIG. 1C, the carrier 10 is removed to expose the circuit layer 11 and a lower surface of the first insulating layer 13.

Figure 1D:
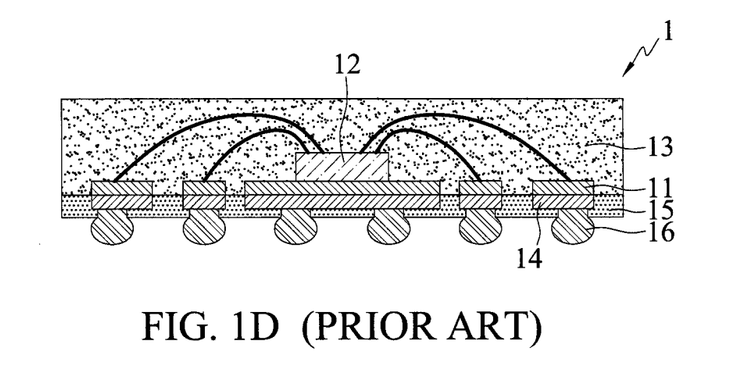

Referring to FIG. 1D, a surface treatment layer 14 is formed on the exposed circuit layer 11, and then a second insulating layer 15 is formed on the lower surface of the first insulating layer 13. Portions of the surface treatment layer 14 are exposed from the second insulating layer 15. Thereafter, a plurality of conductive elements 16 such as solder balls are formed on the exposed portions of the surface treatment layer 14, and a singulation process is performed to obtain a semiconductor package 1.

However, since the circuit layer 11 is flush with the lower surface of the first insulating layer 13, when an SMT (Surface Mounting Technology) process is performed to mount the semiconductor package 1 on a circuit board, it is difficult to align the conductive elements 16 with contacts of the circuit board, thus reducing the yield of the SMT process.

Therefore, there is a need to provide an electronic package structure and a fabrication method thereof so as to overcome the above-described drawbacks.

SUMMARY OF THE INVENTION

In view of the above-described drawbacks, the present invention provides an electronic package structure, which comprises: a first insulating layer having opposite first and second surfaces; a circuit layer embedded in the first insulating layer via the second surface thereof; at least an electronic element embedded in the first insulating layer and disposed on and electrically connected to the circuit layer; and a plurality of conductive bumps formed on the circuit layer with the second surface of the first insulating layer being exposed.

The present invention further provides a method for fabricating an electronic package structure, which comprises the steps of: forming a circuit layer on a conductor; disposing at least an electronic element on the circuit layer, wherein the electronic element is electrically connected to the circuit layer; forming a first insulating layer on the conductor to encapsulate the electronic element and the circuit layer, wherein the first insulating layer has a first surface and a second surface opposite to the first surface and bonded to the conductor; and removing portions of the conductor so as to cause the remaining portions of the conductor to constitute a plurality of conductive bumps with the second surface of the first insulating layer being exposed.

In an embodiment, the conductive bumps protrude above the second surface of the first insulating layer.

In an embodiment, the conductive bumps are free from being aligned with conductive pads of the circuit layer.

In an embodiment, before disposing the electronic element, a surface treatment layer is formed on the circuit layer.

In an embodiment, before disposing the electronic element, a surface treatment layer is formed on the conductor. As such, after removing portions of the conductor, the surface treatment layer remains on the conductive bumps.

In an embodiment, after removing portions of the conductor, a surface treatment layer is formed on the conductive bumps.

In an embodiment, after removing portions of the conductor, a second insulating layer is formed on the second surface of the first insulating layer, and the conductive bumps are exposed from the second insulating layer.

In an embodiment, before forming the circuit layer, an etch stop layer is covered with the conductor. As such, after removing portions of the conductor, the etch stop layer remains on the conductive bumps.

According to the present invention, portions of the conductor are removed to cause the remaining portions of the conductor to constitute a plurality of conductive bumps. As such, when the electronic package structure is disposed on a circuit board through an SMT process, conductive elements on the conductive bumps are easily aligned with contacts of the circuit board, thereby effectively improving the yield of the SMT process.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "first", "second", "a" etc. are merely for illustrative purposes and should not be construed to limit the scope of the present invention.

FIGS. 2A to 2F are schematic cross-sectional views showing a method for fabricating an electronic package structure according to a first embodiment of the present invention.

Figure 2A:
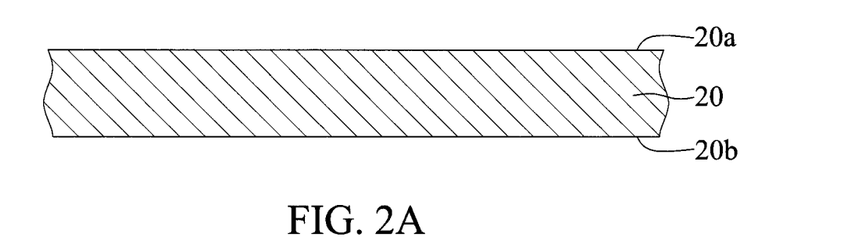
FIGS. 2A to 2F are schematic cross-sectional views showing a method for fabricating an electronic package structure according to a first embodiment of the present invention, wherein FIGS. 2E' to 2F' show another embodiment of FIGS. 2E to 2F.

Referring to FIG. 2A, a conductor 20 having an upper side 20a and a lower side 20b is provided. In the present embodiment, the conductor 20 is a copper foil.

Figure 2B:
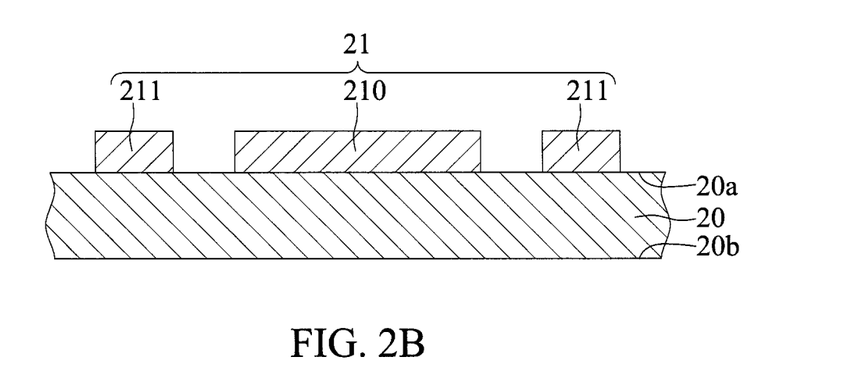

Referring to FIG. 2B, a circuit layer 21 is formed on the upper side 20a of the conductor 20 by copper electroplating or deposition.

In the present embodiment, the circuit layer 21 has at least a die attach pad 210 and a plurality of conductive pads 211.

Figure 4:
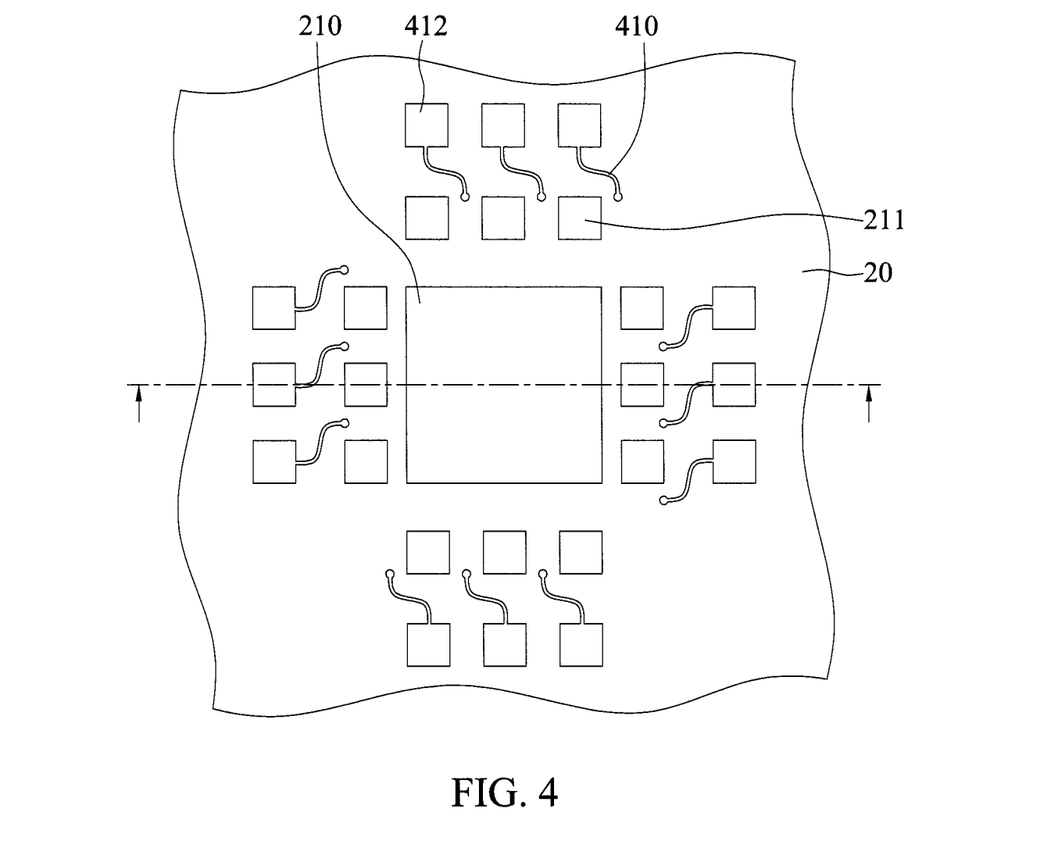
FIG. 4 is a schematic upper view of a circuit layer of an electronic package structure according to the present invention.

In other embodiments, the circuit layer 21 is arranged as shown in FIG. 4. In particular, the circuit layer 21 has a die attach pad 210, a plurality of conductive pads 211, 412, and a plurality of conductive traces 410 around the die attach pad 210. The conductive pads 211 are formed around the die attach pad 210 and the conductive pads 412 are formed at outer ends of the conductive traces 410.

Figure 2C:
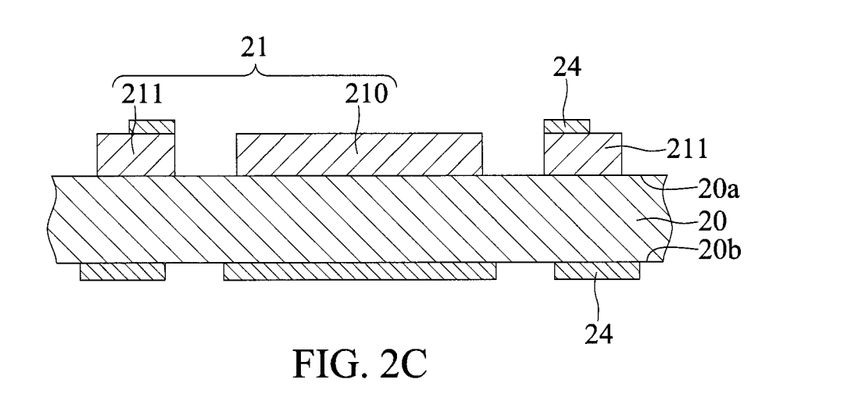

Referring to FIG. 2C, a surface treatment layer 24 is formed on the conductive pads 211 of the circuit layer 21 and portions of the lower side 20b of the conductor 20.

In the present embodiment, the surface treatment layer 24 is a layer of OSP (Organic solderability Preservative), nickel, palladium, gold or silver.

Further, before formation of the surface treatment layer 24, a barrier layer (not shown) can be formed on the circuit layer 21 to prevent migration or diffusion between the surface treatment layer 24 made of gold and the circuit layer 21 made of copper.

Figure 2D:
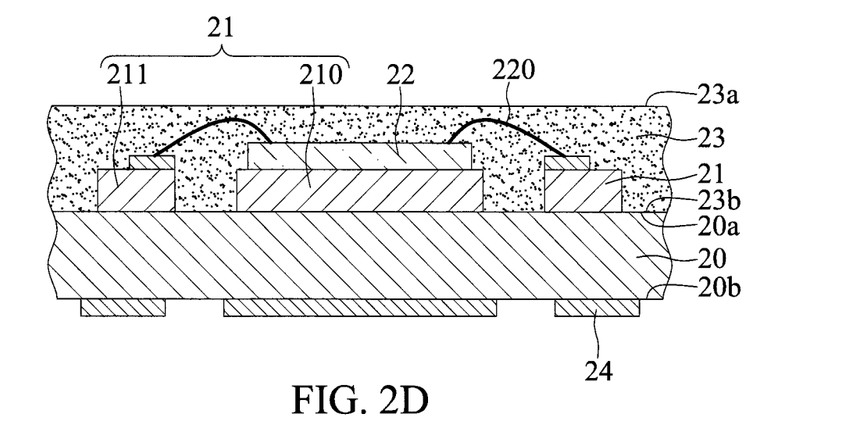

Referring to FIG. 2D, at least an electronic element 22 is disposed on the die attach pad 210 and electrically connected to the conductive pads 211. Then, a first insulating layer 23 is formed on the upper side 20a of the conductor 20 to encapsulate the electronic element 22 and the circuit layer 21.

In the present embodiment, the electronic element 22 is electrically connected to the conductive pads 211 through a plurality of bonding wires 220. The bonding wires 220 are, for example, gold wires. The bonding wires 220 are encapsulated by the first insulating layer 23.

The electronic element 22 can be an active element such as a semiconductor chip, a passive element such as a resistor, a capacitor or an inductor, or a combination thereof. In the present embodiment, the electronic element 22 is an active element.

The first insulating layer 23 is an encapsulant formed by molding. The first insulating layer 23 has a first surface 23a and a second surface 23b opposite to the first surface 23a and bonded to the upper side 20a of the conductor 20.

In other embodiments, an active surface of the electronic element 22 is electrically connected to the conductive pads 211 through a plurality of conductive bumps such as solder balls (not shown), and the first insulating layer 23 is ground to expose an inactive surface of the electronic element 22 from the first surface 23a of the first insulating layer 23 for heat dissipation.

Figure 2E:
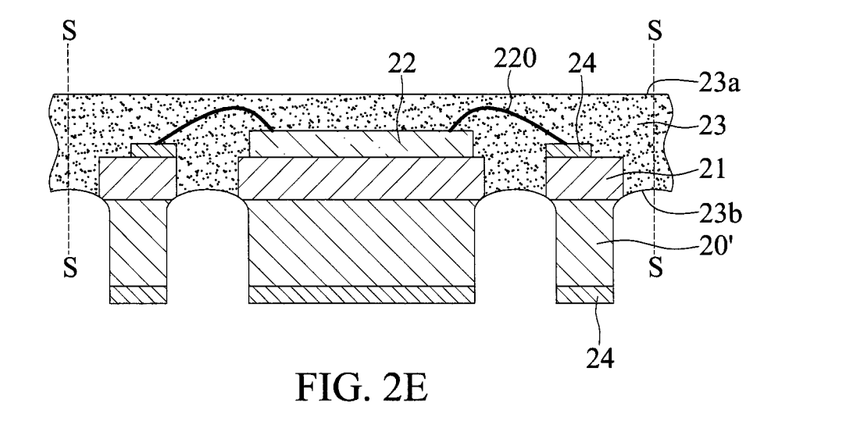

Referring to FIG. 2E, portions of the conductor 20 are removed. The remaining portions of the conductor 20 constitute a plurality of conductive bumps 20', and the second surface 23b of the first insulating layer 23 is exposed.

In the present embodiment, the conductive bumps 20' protrude above the second surface 23b of the first insulating layer 23.

Further, portions of the conductor 20 are removed by etching and hence the second surface 23b of the first insulating layer 23 has a concave shape. The surface treatment layer 24 serves as a resist layer for etching. As such, portions of the conductor 20 covered by the surface treatment layer 24 are retained to constitute the conductive bumps 20', and the surface treatment layer 24 remains on end surfaces of the conductive bumps 20'.

In another embodiment, after removing portions of the conductor 20, a surface treatment layer 24 is further formed on the conductive bumps 20'. Accordingly, an etching resist layer (not shown) needs to be formed before removing portions of the conductor 20.

Further, referring to FIG. 2E', a half etch process can be performed to remove the conductor 20, and the conductive bumps 20" are formed at an outer edge of the circuit layer 21. That is, the conductive bumps 20" are free from being aligned with the conductive pads 211.

Figure 2F:
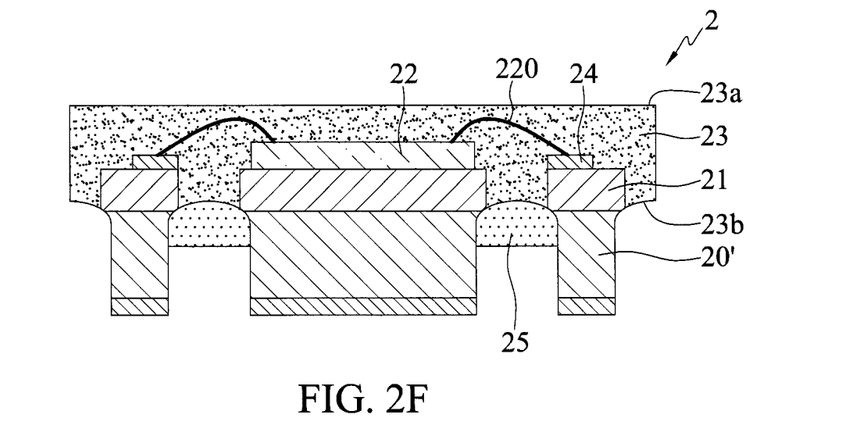

Referring to FIG. 2F, continued from FIG. 2E, a second insulating layer 25 is formed on the second surface 23b of the first insulating layer 23, and the conductive bumps 20' protrude above the second insulating layer 25. Then, a singulation process is performed along a cutting path S of FIG. 2E so as to obtain an electronic package structure 2.

In the present embodiment, the second insulating layer 25 is a solder mask layer. Subsequently, a plurality of conductive elements such as solder balls (not shown) can be formed on the conductive bumps 20'.

Further, referring to FIG. 2F', which is continued from FIG. 2E', an electronic package structure 2' is obtained.

According to the present invention, since the conductive bumps 20', 20" protrude above the second surface 23b of the first insulating layer 23, when the electronic package structure 2, 2' is disposed on a circuit board (not shown) through an SMT process, conductive elements (not shown) on the conductive bumps 20', 20" are easily aligned with contacts of the circuit board, thus effectively improving the yield of the SMT process.

FIGS. 3A to 3F are schematic cross-sectional views showing a method for fabricating an electronic package structure according to a second embodiment of the present invention. The difference of the second embodiment from the first embodiment is detailed as follows.

Figure 3A:
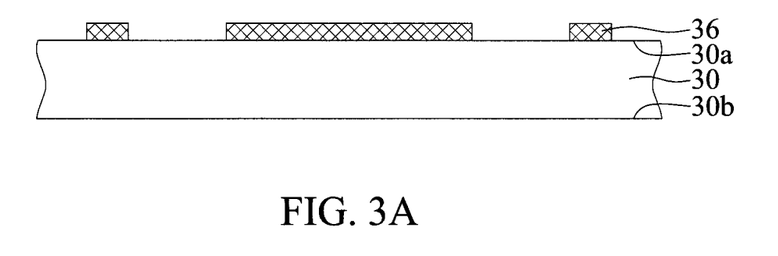
FIGS. 3A to 3F are schematic cross-sectional views showing a method for fabricating an electronic package structure according to a second embodiment of the present invention.

Referring to FIG. 3A, a carrier 30 having an upper side 30a and a lower side 30b is provided and an etch stop layer 36 is formed on the upper side 30a of the carrier 30.

Figure 3B:
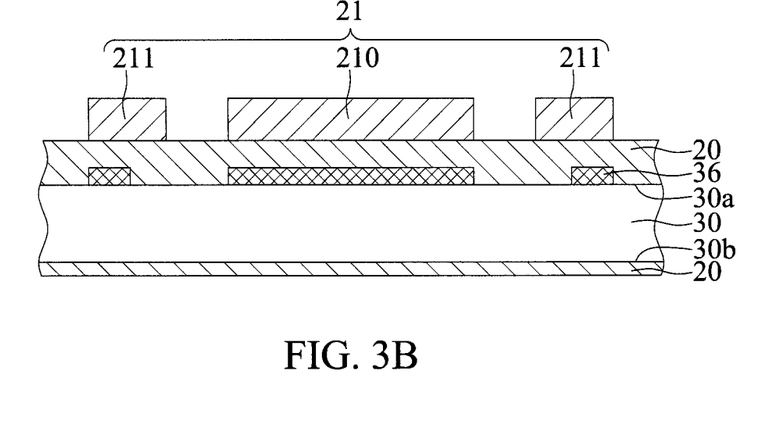

Referring to FIG. 3B, a conductor 20 is formed on the carrier 30 and covers the etch stop layer 36. Then, a circuit layer 21 is formed on the conductor 20.

Figure 3C:
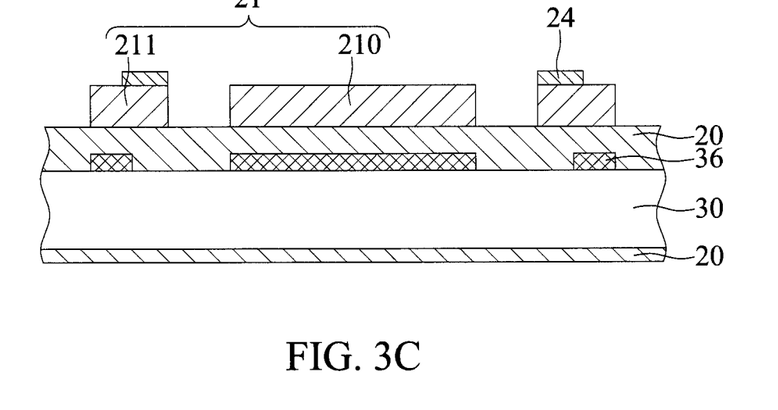

Referring to FIG. 3C, a surface treatment layer 24 is formed on conductive pads 211 of the circuit layer 21.

Figure 3D:
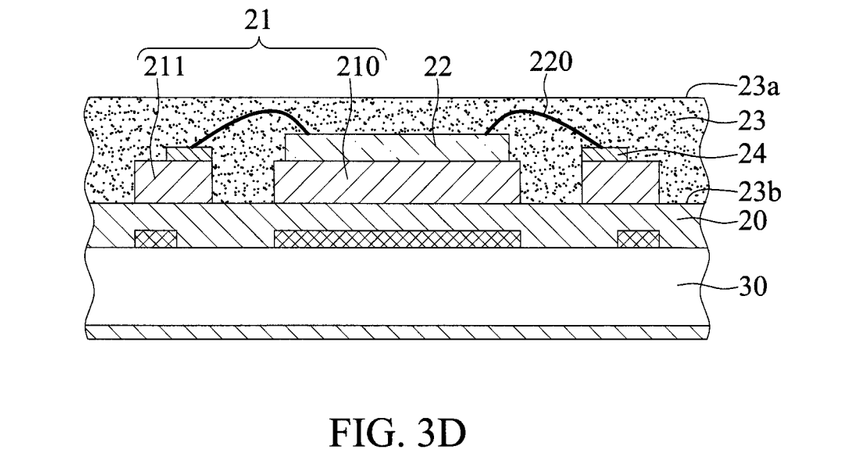

Referring to FIG. 3D, at least an electronic element 22 is disposed on a die attach pad 210 of the circuit layer 21 and electrically connected to the conductive pads 211 of the circuit layer 21. Then, a first insulating layer 23 is formed on the conductor 20 to encapsulate the electronic element 22 and the circuit layer 21. The first insulating layer 23 has a first surface 23a and a second surface 23b opposite to the first surface 23a and bonded to the conductor 20.

Figure 3E:
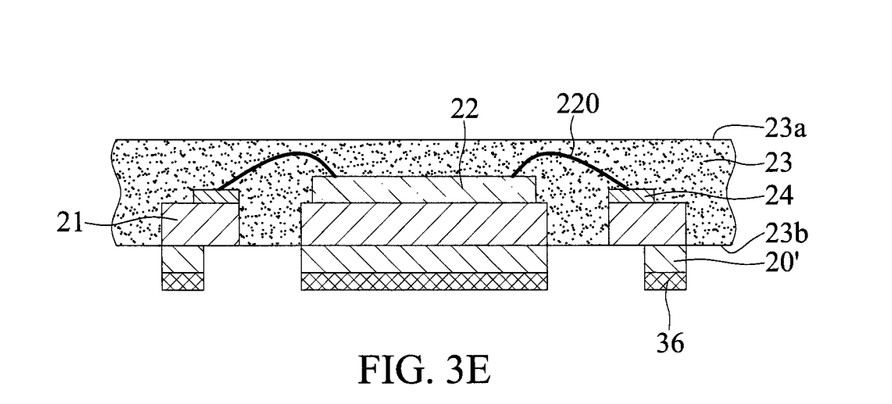

Referring to FIG. 3E, the carrier 30 and portions of the conductor 20 are removed. The remaining portions of the conductor 20 constitute a plurality of conductive bumps 20' and the second surface 23b of the first insulating layer 23 is exposed.

In the present embodiment, portions of the conductor 20 are removed by etching. The etch stop layer 36 is used as a resist layer for etching. As such, portions of the conductor 20 covered by the etch stop layer 36 are retained to constitute the conductive bumps 20'. The etch stop layer 36 remains on end surfaces of the conductive bumps 20'.

Figure 3F:
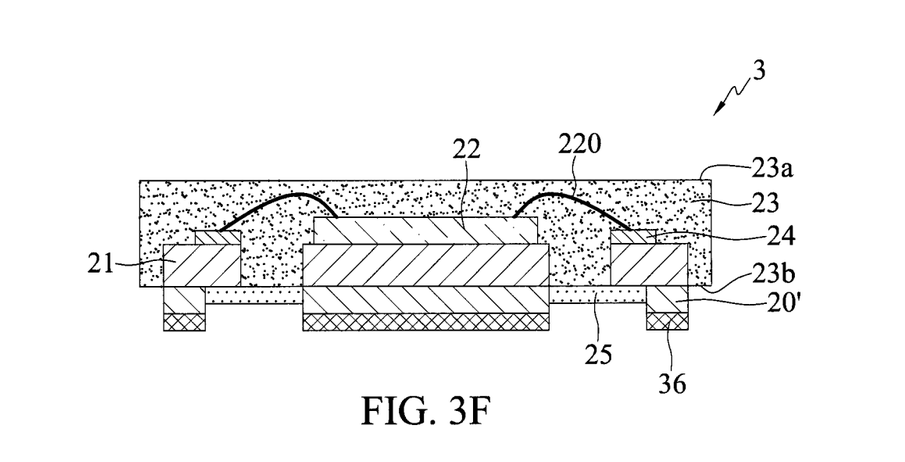

Referring to FIG. 3F, a second insulating layer 25 is formed on the second surface 23b of the first insulating layer 23, and the conductive bumps 20' are exposed from the second insulating layer 25. Then, a singulation process is performed to obtain an electronic package structure 3.

The present invention further provides an electronic package structure 2, 2', 3, which has: a first insulating layer 23 having opposite first and second surfaces 23a, 23b; a circuit layer 21 embedded in the first insulating layer 23 via the second surface 23b thereof; an electronic element 22 embedded in the first insulating layer 23 and disposed on and electrically connected to the circuit layer 21; and a plurality of conductive bumps 20', 20" formed on the circuit layer 21 with the second surface 23b of the first insulating layer 23 being exposed.

In an embodiment, the conductive bumps 20', 20" protrude above the second surface 23b of the first insulating layer 23.

In an embodiment, the electronic package structure 2, 2', 3 further has a surface treatment layer 24 formed on the circuit layer 21.

In an embodiment, the electronic package structure 2, 2' further has a surface treatment layer 24 formed on the conductive bumps 20', 20".

In an embodiment, the electronic package structure 2, 2', 3 further has a second insulating layer 25 formed on the second surface 23b of the first insulating layer 23, and the conductive bumps 20' are exposed from the second insulating layer 25.

In an embodiment, the electronic package structure 3 further has an etch stop layer 36 formed on the conductive bumps 20'.

According to the present invention, portions of the conductor are removed to cause the remaining portions of the conductor to constitute a plurality of conductive bumps. As such, when the electronic package structure is disposed on a circuit board through an SMT process, conductive elements on the conductive bumps are easily aligned with contacts of the circuit board, thereby effectively improving the yield of the SMT process.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic package structure, comprising:
   a first insulating layer having opposite first and second surfaces;
   a circuit layer embedded in the first insulating layer via the second surface thereof;
   at least an electronic element embedded in the first insulating layer and disposed on and electrically connected to the circuit layer; and
   a plurality of conductive bumps formed on the circuit layer with the second surface of the first insulating layer being exposed.

2. The electronic package structure of claim 1, wherein the conductive bumps protrude above the second surface of the first insulating layer.

3. The electronic package structure of claim 1, wherein the conductive bumps are free from being aligned with conductive pads of the circuit layer.

4. The electronic package structure of claim 1, further comprising a surface treatment layer formed on the circuit layer.

5. The electronic package structure of claim 1, further comprising a surface treatment layer formed on the conductive bumps.

6. The electronic package structure of claim 1, further comprising a second insulating layer formed on the second surface of the first insulating layer, wherein the conductive bumps are exposed from the second insulating layer.

7. The electronic package structure of claim 1, further comprising an etch stop layer formed on the conductive bumps.

8. A method for fabricating an electronic package structure, comprising the steps of:
   forming a circuit layer on a conductor;
   disposing at least an electronic element on the circuit layer, wherein the electronic element is electrically connected to the circuit layer;
   forming a first insulating layer on the conductor to encapsulate the electronic element and the circuit layer, wherein the first insulating layer has a first surface and a second surface opposite to the first surface and bonded to the conductor; and
   removing portions of the conductor so as to cause the remaining portions of the conductor to constitute a plurality of conductive bumps with the second surface of the first insulating layer being exposed.

9. The method of claim 8, wherein the conductive bumps protrude above the second surface of the first insulating layer.

10. The method of claim 8, wherein the conductive bumps are free from being aligned with conductive pads of the circuit layer.

11. The method of claim 8, before disposing the electronic element, further comprising forming a surface treatment layer on the circuit layer.

12. The method of claim 8, before disposing the electronic element, further comprising forming a surface treatment layer on the conductor.

13. The method of claim 12, wherein after removing portions of the conductor, the surface treatment layer remains on the conductive bumps.

14. The method of claim 8, after removing portions of the conductor, further comprising forming a surface treatment layer on the conductive bumps.

15. The method of claim 8, after removing portions of the conductor, further comprising forming a second insulating layer on the second surface of the first insulating layer, wherein the conductive bumps are exposed from the second insulating layer.

16. The method of claim 8, before forming the circuit layer, further comprising covering an etch stop layer with the conductor.

17. The method of claim 16, wherein after removing portions of the conductor, the etch stop layer remains on the conductive bumps.

* * * * *